(12) United States Patent
Adachi

(10) Patent No.: US 7,619,198 B2
(45) Date of Patent: Nov. 17, 2009

(54) IMAGING DEVICE AND IMAGING DEVICE DRIVE METHOD

(75) Inventor: Satoru Adachi, Tsuchiura (JP)

(73) Assignee: Texas Instruments Incorporated, Dallas, TX (US)

( * ) Notice: Subject to any disclaimer, the term of this patent is extended or adjusted under 35 U.S.C. 154(b) by 122 days.

(21) Appl. No.: 12/061,148

(22) Filed: Apr. 2, 2008

(65) Prior Publication Data

US 2008/0251691 A1  Oct. 16, 2008

(30) Foreign Application Priority Data

Apr. 4, 2007 (JP) .............................. 2007-098292

(51) Int. Cl.
*H01J 40/14* (2006.01)
(52) U.S. Cl. .................. 250/208.1; 348/308; 250/214.1
(58) Field of Classification Search ............. 205/208.1, 205/214.1; 348/308
See application file for complete search history.

(56) References Cited

U.S. PATENT DOCUMENTS

| 5,955,753 | A | 9/1999 | Takahashi | |
|---|---|---|---|---|
| 6,757,627 | B2 * | 6/2004 | Mizuno | 702/65 |
| 7,030,357 | B2 | 4/2006 | Lee | |
| 7,209,166 | B2 * | 4/2007 | Krymski | 348/221.1 |
| 7,442,911 | B2 * | 10/2008 | Suzuki et al. | 250/214 A |
| 2003/0020002 | A1 * | 1/2003 | Lee | 250/208.1 |
| 2005/0128327 | A1 | 6/2005 | Bencuya et al. | |
| 2006/0102827 | A1 * | 5/2006 | Kasuga et al. | 250/208.1 |
| 2006/0139469 | A1 | 6/2006 | Yokota et al. | |
| 2006/0187328 | A1 | 8/2006 | Lim | |
| 2007/0008420 | A1 | 1/2007 | Roh | |

FOREIGN PATENT DOCUMENTS

JP   2006-217410   8/2006

* cited by examiner

*Primary Examiner*—Georgia Y Epps
*Assistant Examiner*—Tony Ko
(74) *Attorney, Agent, or Firm*—Robert D. Marshall, Jr.; Wade J. Brady, III; Frederick J. Telecky, Jr.

(57) ABSTRACT

The problem of the invention is to improve S/N and provide a high-sensitivity imaging device. The CMOS image sensor includes multiple pixels arranged in a two-dimensional array, where each pixel includes a photodiode PD that receives light to produce charge, a capacitance element FD, and a transfer transistor M1 connected between photodiode PD and capacitance element FD, where the capacitance of capacitance element FD is less than the capacitance of photodiode PD. With the drive method, transfer transistor M1 turns on during a predetermined period in a first charge transfer mode after the charge accumulation period is completed; first charge Q1 accumulated on photodiode PD is transferred to capacitance element FD; the charge on capacitance element FD is then reset; transfer transistor M1 turns on during a predetermined period in a second charge transfer mode after reset is completed; and second charge Q2 accumulated on photodiode PD is transferred to transfer element FD.

14 Claims, 9 Drawing Sheets

CONVENTIONAL EXAMPLE

THIS EMBODIMENT

FIG. 8
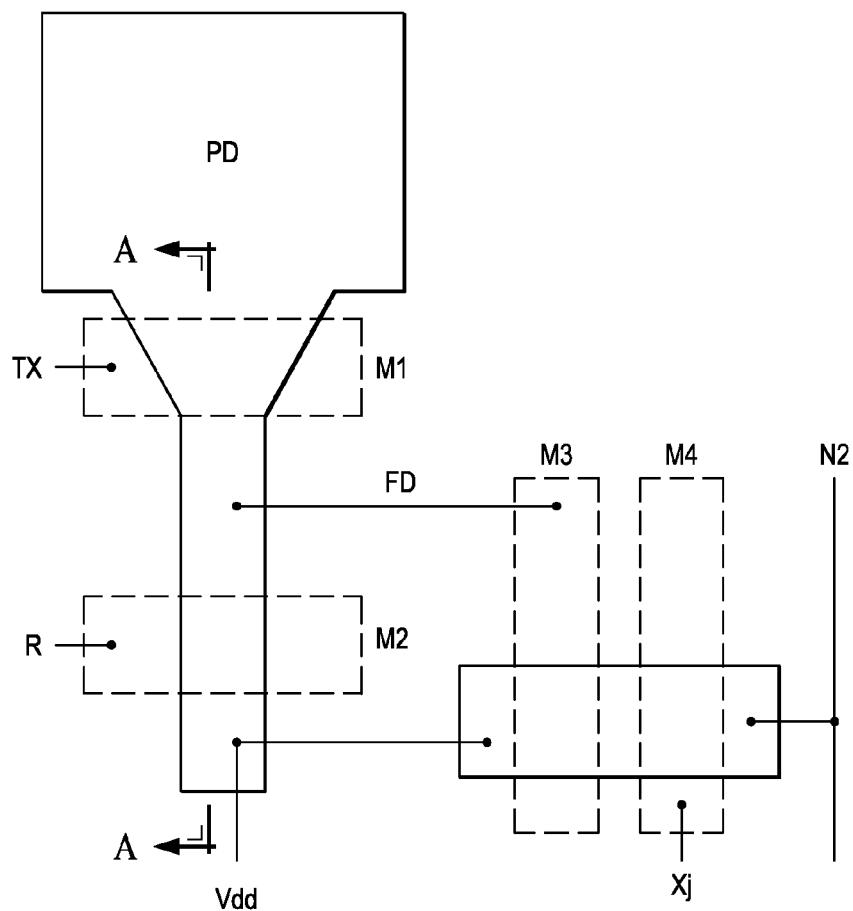
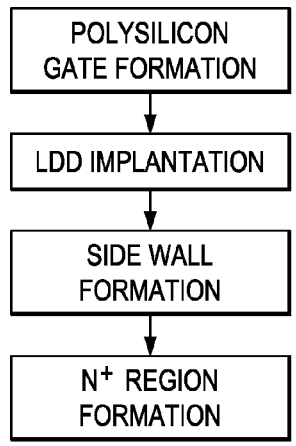
FIG. 10A
(PRIOR ART)
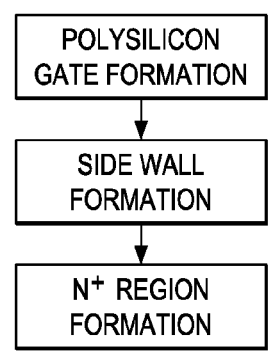
FIG. 10B

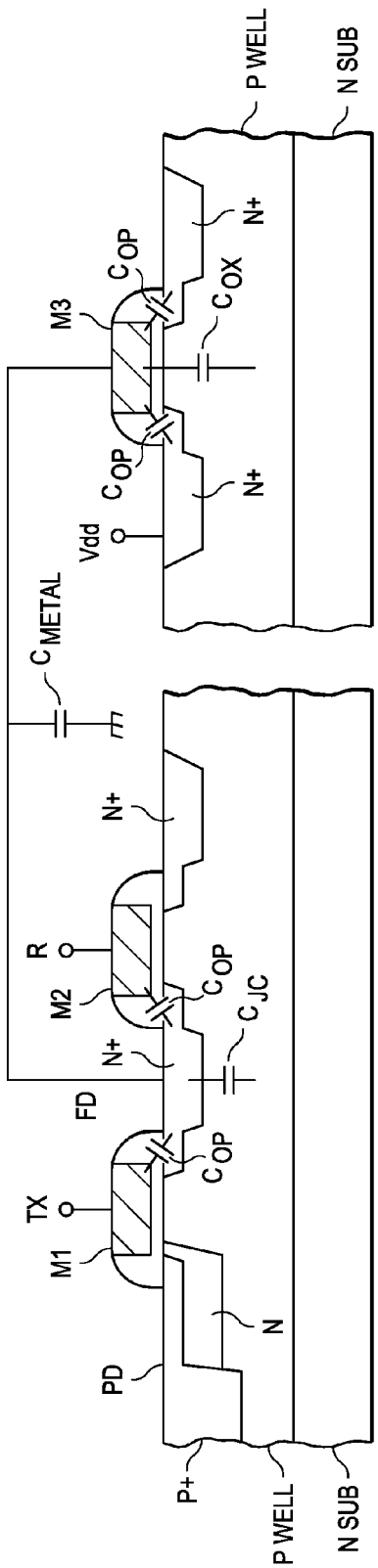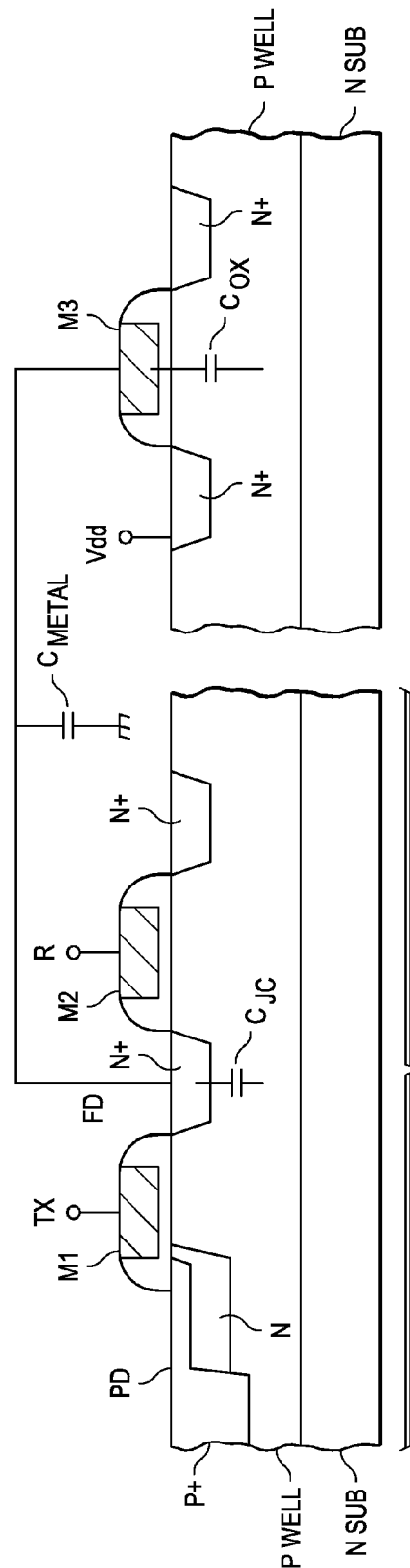

IMAGING DEVICE AND IMAGING DEVICE DRIVE METHOD

TECHNICAL FIELD OF THE INVENTION

The present invention relates to an imaging device that includes an array in which multiple pixels are arranged in the form of a matrix.

BACKGROUND OF THE INVENTION

CMOS image sensors (Complementary Metal Oxide Semiconductor) and CCD sensors (Charge Coupled Device) are used in endoscopes, digital cameras, scanners and other electronic devices. Since they have an amplifier for each unit cell, CMOS image sensors can produce signals with a higher S/N ratio compared with CCD sensors. They also have the advantage that the power consumption can be controlled by using a CMOS logic device manufacturing process.

In regard to CMOS image sensors of this type, Japanese Kokai Patent Publication No. 2006-217410 discloses a solid-state imaging device with a wide dynamic range that includes an overflow gate that transfers overflow photoelectric charge from a photodiode to an accumulating capacitance element during an accumulation operation. This maintains both high sensitivity and a high S/N ratio.

FIG. 12 illustrates the construction of one pixel of a conventional CMOS image sensor and a column output circuit that outputs a signal read from the one pixel. Pixel Pj includes a photodiode PD for photoelectric conversion, a transfer transistor (transfer gate) M1 connected to photodiode PD, a reset transistor M2 connected to transfer transistor M1, a source follower transistor M3, the gate of which is connected to node N1 that connects transfer transistor M1 and reset transistor M2 and a row (line) selection transistor M4 connected between source follower transistor M3 and column (rank) signal line CLj (vertical signal line). Pixel Pj comprises four transistors M1, M2, M3 and M4 which are N-channel enhancement mode MOS transistors.

Transistors M1, M2, M3 and M4 are off during the light exposure period or charge accumulation period of photodiode PD. After completion of the charge accumulation period, gate signal Xj of transistor M4 goes high, pixel Pj is selected to begin reading pixel Pj. FIG. 12 illustrates only one pixel Pj, but all the pixels on one line in the array are selected when gate signal Xj goes high.

When the read period starts, gate signal R of reset transistor M2 goes high. The capacitance of parasitic capacitance $C_{FD}$ at a floating diffusion (FD) at node N1 is reset to Vdd. After reset transistor M2 is turned off, gate signal TX of transfer transistor M1 goes high to transfer all the charge accumulated in photodiode PD to FD. The transferred charge supplied the input to the gate of source follower transistor M3. Transistors M3 and M4 produce an amplified input voltage at node N2 of column signal line CLj.

A column signal line is connected to each of the pixels in each column of the array. A constant current source I is also connected between node N2 and ground of the column signal line. Sample-and-hold signal SH causes sample-and-hold transistor M5 to accumulate the signal of pixel Pj at node N2 of column signal line CLj in capacitor C. This accumulated signal is read when gate signal ΦCol of column output transistor M6 goes high. In this way, signals for one line's worth of pixels are read via the column signal line from multiple pixels arranged two-dimensionally, and the signals for one line's worth of pixels will be output in sequence to each pixel.

In order to improve the sensitivity of the CMOS image sensor, the S/N ratio of the signals read from pixels must be improved. The charge accumulated in photodiode PD can be considered as being amplified by a multistage amplifier circuit and output. FIG. 13 represents this multistage amplifier circuit schematically. Equation (1) gives the noise factor F in such a multistage amplifier circuit.

$$F = F_1 + \frac{F_2 - 1}{G_1} + \frac{F_3 - 1}{G_1 G_2} + \frac{F_4 - 1}{G_1 G_2 G_3} + \ldots \quad (1)$$

If the value of F approaches 1, the noise rejection performance will improve.

As is evident from equation (1), the S/N ratio may be improved by raising the gain of the initial stage. For this purpose, capacitance $C_{FD}$ of FD of a pixel may be made smaller, and signal voltage VF ($V_{FD}=Q/C_{FD}$) of the charge accumulated in FD may be made larger. However, when capacitance $C_{FD}$ of FD is made smaller, capacitance $C_{PD}$ of photodiode PD must also be made correspondingly smaller. This is because all the charge accumulated in photodiode PD must be transferred to FD. The maximum amplitude of photodiode PD is about 1 V. When capacitance $C_{PD}$ of photodiode PD becomes smaller, the amount of charge accumulated in photodiode PD corresponding to the number of electrons decreases.

External light includes so-called shot noise. When the number of electrons accumulated in photodiode PD drops below a certain constant value, the S/N ratio falls. The S/N ratio of photodiode PD can be represented by the equation (2).

$$\frac{S}{N} = 20\log\left(\frac{\text{Signal}(N)}{\sqrt{\text{Signal}(N)}}\right) \quad (2)$$

where: N is the number of accumulated electrons. To suppress the effects caused by shot noise, the S/N ratio should be 40 dB or more.

Thus with a conventional CMOS image sensor, when capacitance $C_{FD}$ of FD is made smaller with the intention of improving the S/N ratio (gain) to improve sensitivity, the number of electrons accumulated in photodiode PD decreases, and conversely, there is the incompatible problem of the S/N ratio dropping. The present invention solves this trade-off problem by improving the S/N ratio and providing a high-sensitivity imaging device.

SUMMARY OF THE INVENTION

The imaging device of this invention includes multiple pixels arranged in a two-dimensional array. Each pixel includes a photodiode that receives light to produce charge, a capacitance element and a transfer transistor connected between the photodiode and the capacitance element. The capacitance of the capacitance element is less than the capacitance of the photodiode. The drive method includes the following steps: an accumulation step to turn the transfer transistor off and accumulate charge in the photodiode isolated from the capacitance element; a first transfer step that turns the transfer transistor on for a fixed period in a first charge transfer mode and transfer the first charge accumulated in the photodiode to the capacitance element; a step to reset the capacitance element; and a second transfer step that turns the transfer transistor on for a fixed period in a second charge transfer mode and transfers the second charge accumulated in the photodiode to the capacitance element.

The drive method additionally includes a synthesis step that synthesizes the first charge transferred in the first transfer step and the second charge transferred in the second transfer step. The drive method could additionally include a step to determine whether the first charge transferred in the first transfer step is smaller than a first threshold value, and when it is determined to be smaller, the synthesis step would not synthesize the first charge and the second charge. The drive method could additionally include a step to determine whether the second charge transferred in the second transfer step is larger than a second threshold value, and when it is larger, the synthesis step would not synthesize the first charge and the second charge.

The drive method could additionally include a step to convert the first and second analog signals obtained by the first and second transfer steps into first and second digital signals, and the synthesis step could synthesize the converted first and second digital signals.

Preferably, a first voltage signal is applied to the gate of the transfer transistor in the first transfer step, a second voltage signal is applied to the gate of the transfer transistor in the second transfer step with the second voltage larger than the first voltage. More preferably, the first transfer step, the reset step, and the second transfer step are performed during the horizontal blanking period.

The imaging device pertaining to the present invention has multiple pixels arranged in a matrix. Each pixel includes a photodiode that photoelectrically converts received light, a capacitance element having a capacitance smaller than the capacitance of the photodiode and a transfer transistor connected between the photodiode and the capacitance element, and a drive circuit that supplies a first transfer signal that turns the transfer transistor on in a first charge transfer mode and a second transfer signal that turns the transfer transistor on in a second charge transfer mode. The transfer transistor transfers the first charge accumulated in the photodiode to the capacitance element in response to the first transfer signal and the second charge accumulated in the photodiode to the capacitance element in response to the second transfer signal.

Preferably, each pixel additionally includes a reset transistor for resetting the charge of the capacitance element. The drive circuit additionally supplies a reset signal for resetting the transistor to the reset transistor between the first transfer signal and the second transfer signal.

Preferably, the imaging device additionally includes a column output circuit connected to each pixel via a column signal line. The he column output circuit includes a circuit that accepts the first and second signals produced on the basis of the aforementioned transferred first and second charges via the aforementioned column signal line and synthesizes the first and second signals.

The column output circuit could also include an analog-to-digital conversion circuit that converts the first and second signals. The synthesizing circuit could synthesize the digitally converted first and second signals. The synthesizing circuit could also include a first accumulation circuit where the first signal is accumulated and a second accumulation circuit where the second signal is accumulated and could synthesize the first and second signals accumulated by the first and second accumulation circuits. In this case, the first and second accumulation circuits include first and second transistors connected to the column signal line and first and second capacitors connected to the first and second transistors. The drive circuit supplies first and second drive signals for driving the first and second transistors in response to the first transfer signal to the first transistor and the second transfer signals to the second transistors.

It is also possible that at least a MOS transistor to which the capacitance element is connected does not include a source or drain region produced using LDD implantation to reduce parasitic capacitance between the gate electrode and the source or drain region. In this case, the MOS transistor constituting the circuit excluding the aforementioned multiple pixels has an LDD structure.

The electronic device of the present invention includes an imaging device with the described construction and a display device that displays signals output from the imaging device. The imaging system of the present invention includes an imaging device with the aforementioned constitution and a processing device that processes signals output from the imaging device. The electronic device or imaging device is, for example, a digital camera, endoscope, display system, etc.

BRIEF DESCRIPTION OF THE DRAWINGS

These and other aspects of this invention are illustrated in the drawings, in which:

FIG. 2 illustrates the concept of the CMOS image sensor of this embodiment, where

FIG. 8 is a schematic plan view of a four-transistor pixel of this embodiment;

FIG. 9 is a cross section through line A-A in FIG. 8, where FIG. 9(a) shows the parasitic capacitance of a conventional FD and FIG. 9(b) shows the parasitic capacitance in this embodiment;

FIG. 10 illustrates a process for reducing the parasitic capacitance of floating diffusion (FD);

FIG. 11 illustrates other pixel configuration examples, where

DETAILED DESCRIPTION OF PREFERRED EMBODIMENTS

With the present invention, when accumulated charge is transferred to the photodiode, the signal voltage can be increased by making the capacitance of the capacitance element smaller while the gain can be made larger. Thus, the S/N ratio and the sensitivity are improved. On the other hand, because the capacitance of the photodiode is not made as small as the capacitance of the capacitance element, the charge accumulated in the photodiode can be kept to a fixed value. Thus noise is suppressed and the S/N ratio is improved.

An optimal embodiment of the present invention will be explained below in detail with reference to the Figures. Here, a CMOS image sensor is illustrated.

Figure 1:
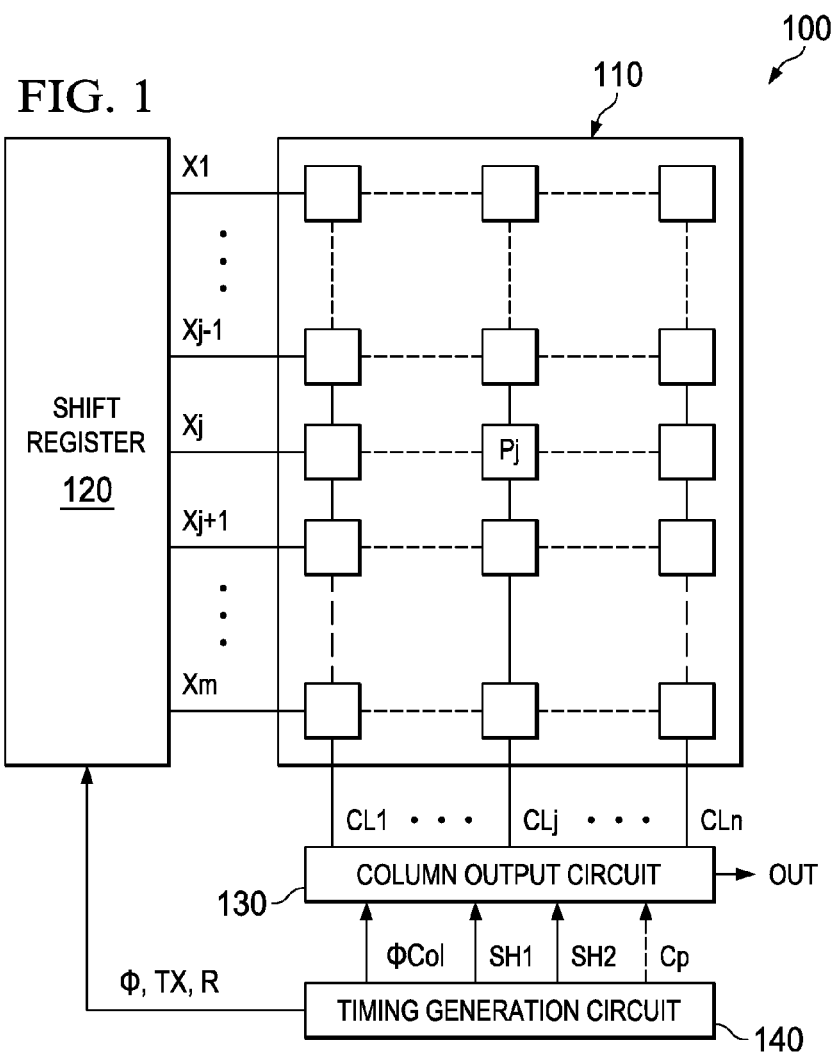
FIG. 1 is a block diagram showing the construction of a CMOS image sensor of an embodiment of the present invention.

FIG. 1 is a block diagram showing the construction of a CMOS image sensor of an embodiment of the present invention. CMOS image sensor 100 comprises: an array 110 of multiple pixels arranged in m rows and n columns; a shift register 120 connected to each pixel of array 110 via row selection lines Xp (p=1, 2 ..., k, ... m); an output circuit 130 connected to the pixels in each column of array 110 via column signal lines CLq (q=1, 2, ... k, ... n); and a timing generation circuit 140 that produces various timing signals Φ, ΦCol, SH1, SH2, TX and R. The array and circuits are formed monolithically on a single semiconductor substrate.

Shift register 120 selects row selection lines Xp in sequence from X1 to Xn based on clock signal Φ supplied from timing generation circuit 140. For example, when shift register 120 drives row selection line Xj high, the n pixels connected to row selection line Xj are selected. Each pixel includes a photodiode that converts received light into charge. When n pixels are selected by shift register 120, the charge of the n pixels is read to column output circuit 130 via a corresponding column signal line CLq. Column output circuit 130 holds one line's worth of signals corresponding to the charge of the n pixels, and sequentially outputs the held n signals from output terminal OUT synchronous with signal ΦCol supplied from timing generation circuit 140.

Figure 12:
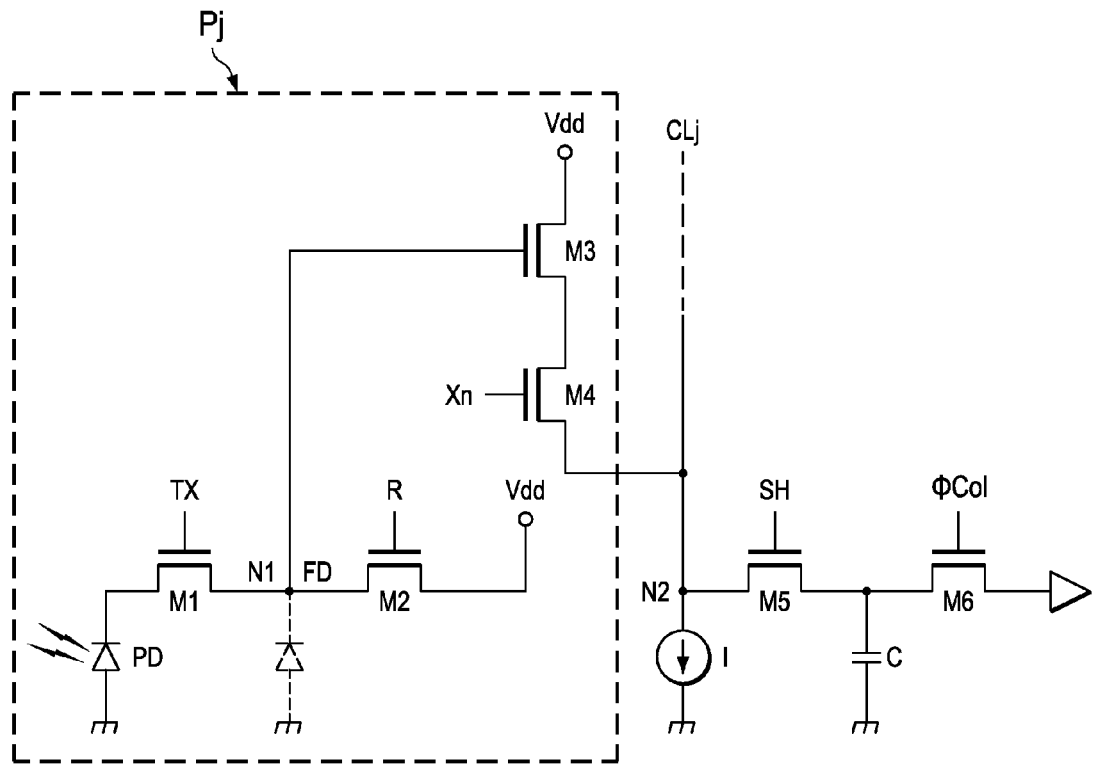
FIG. 12 illustrates a circuit example for a conventional 4-transistor pixel.
Figure 13:
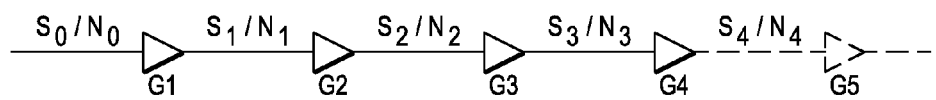
FIG. 13 shows noise factor F in a multistage amplifier circuit.

FIG. 2 explains the concept of the CMOS image sensor of this embodiment. The circuit configuration of the pixels is essentially the same as the circuit configuration shown in FIG. 12, but in the conventional CMOS image sensor, capacitance $C_{PD}$ of photodiode PD and capacitance $C_{FD}$ of FD are approximately equal. In contrast, in the CMOS image sensor of this invention, capacitance $C_{FD}$ of floating diffusion FD is less than capacitance $C_{PD}$ of photodiode PD. In the conventional CMOS image sensor, the charge accumulated in photodiode PD is transferred one time to FD. In contrast in the image sensor of this invention, the charge accumulated in photodiode PD is transferred to FD multiple times.

The case in which capacitance $C_{FD}$ of the floating diffusion is about ½ of capacitance $C_{PD}$ of photodiode PD and the charge accumulated in photodiode PD is transferred to FD during 2 times will be explained below and compared with a conventional CMOS image sensor.

Figure 2A:
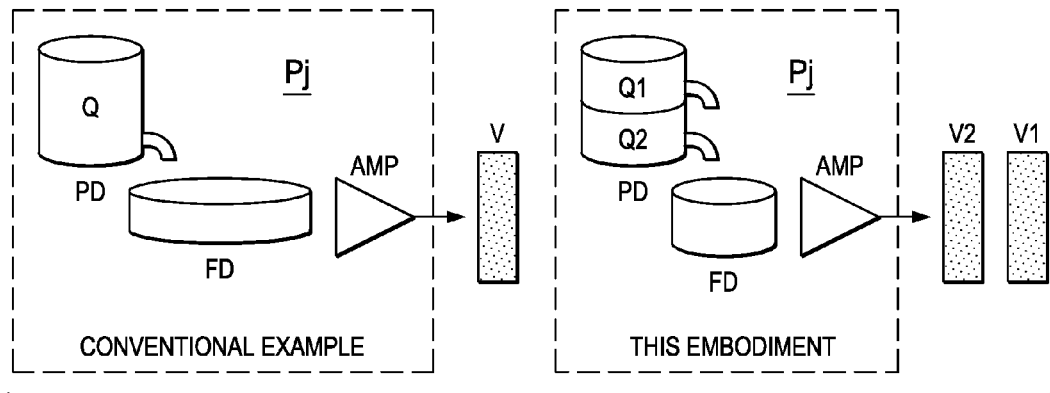
FIG. 2(a) is an example with a light quantity of 100%.

FIG. 2(a) illustrates for a given pixel Pj, when photodiode PD receives a light quantity of 100%. A conventional CMOS image sensor will transfer all of charge Q accumulated in capacitance $C_{PD}$ of photodiode PD to FD by turning the transfer transistor on. The transferred charge is amplified by source follower transistor M3, and a signal with voltage V (V=Q/$C_{PD}$) corresponding charge Q is obtained.

In contrast in this invention, the on mode of transfer transistor M1 includes 2 stages. The on-resistance of transfer transistor M1 is variable since the gate voltage applied to transfer transistor M1 is varied. In the first transfer, the transfer transistor turns on in a first transfer mode, and a charge (Q1) equal to about half of charge Q accumulated in capacitance $C_{FD}$ of photodiode FD is transferred to FD. A signal with voltage V1 corresponding charge Q1 is obtained. In the second transfer, the transfer transistor turns on in a second transfer mode, the remaining charge Q2 of charge Q accumulated in capacitance $C_{PD}$ of photodiode FD is transferred to FD. A signal with voltage V2 corresponding charge Q2 is obtained. By synthesizing the signal with voltage V1 and the signal with voltage V2, essentially a signal corresponding to charge Q (Q=Q1+Q2) can be obtained. Voltage V1 and V2 increase by increasing capacitance $C_{FD}$ of FD, and the gain of FD can be increased. Moreover, the reduction of charge Q accumulated in photodiode PD can be inhibited.

Figure 2B:
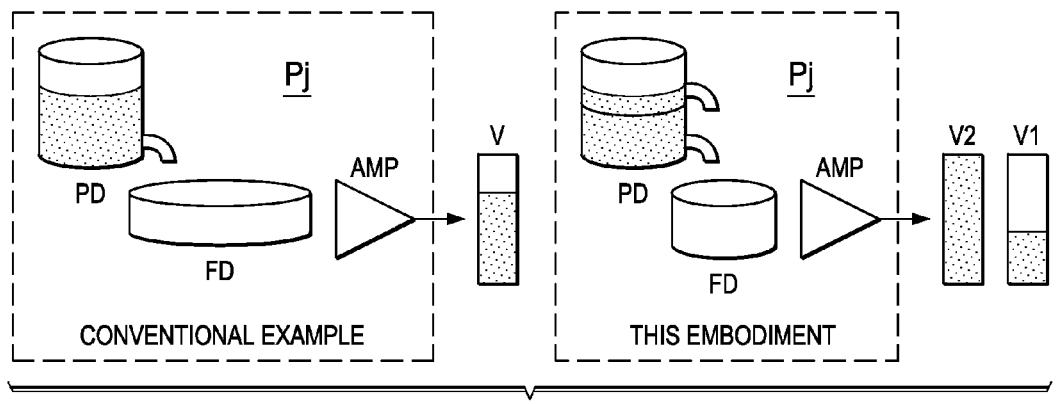
FIG. 2(b) is an example with a light quantity of 70%.
Figure 2C:
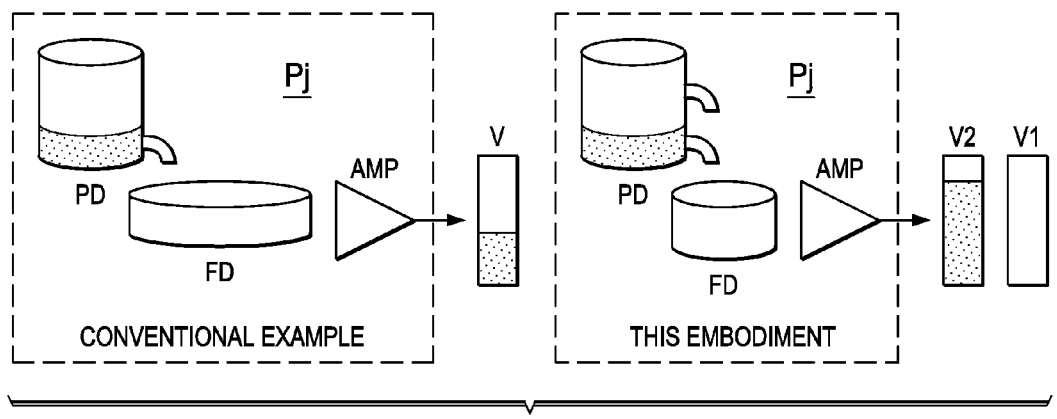
FIG. 2(c) is an example with a light quantity of 40%.

FIG. 2(b) shows a comparison of the conventional sensor and this embodiment when a light quantity of 70% is received, and FIG. 2(c) shows a similar comparison when a light quantity of 40% is received. FIG. 2(c) illustrates that when a light quantity of 50% or less is received, in the first transfer charge Q1 transferred from photodiode PD to FD is essentially zero, i.e., no charge is transferred. In such cases, when a signal produced by charge Q1 and a signal produced by charge Q2 are synthesized, the noise contained therein is added, regardless of whether the signal produced by charge Q1 is zero. This is undesirable. Therefore, if the light quantity is less than 50%, synthesis of the signal produced by charge Q1 and the signal produced by charge Q2 need not necessarily take place.

FIG. 3 is a potential diagram that schematically shows the transfer operation for the charge accumulated in photodiode PD. As shown in FIG. 3(a), reset transistor M2 is turned on prior to transferring charge Q accumulated in photodiode PD. This resets the potential of FD. By resetting the potential, potential $V_{FD}$ formed in FD is higher than potential $V_{PD}$ of photodiode PD.

Figure 3A:
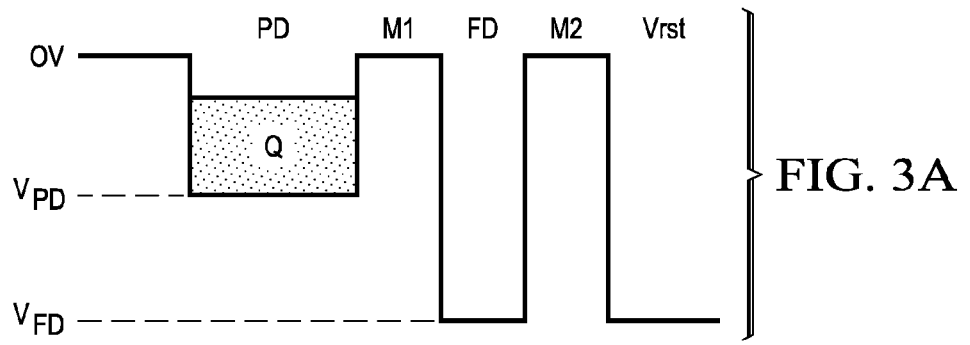
FIG. 3 illustrates the photodiode pixel transfer operation by this embodiment.
Figure 3B:
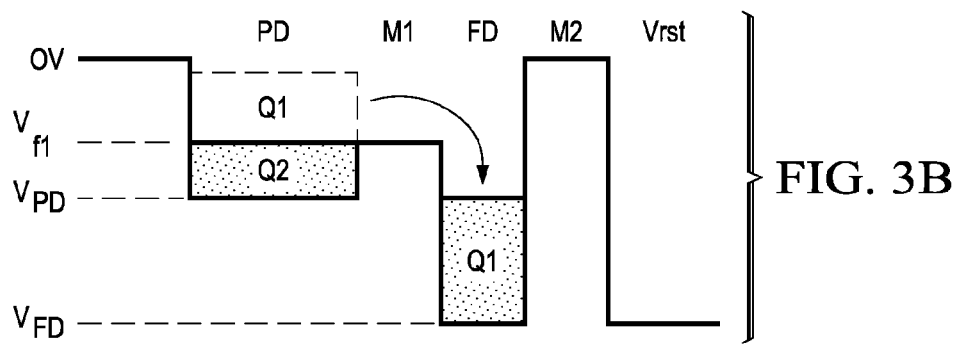
Figure 3C:
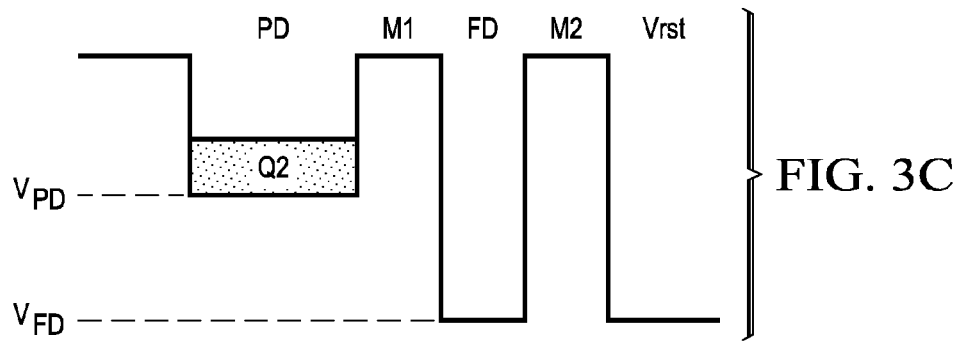
Figure 3D:
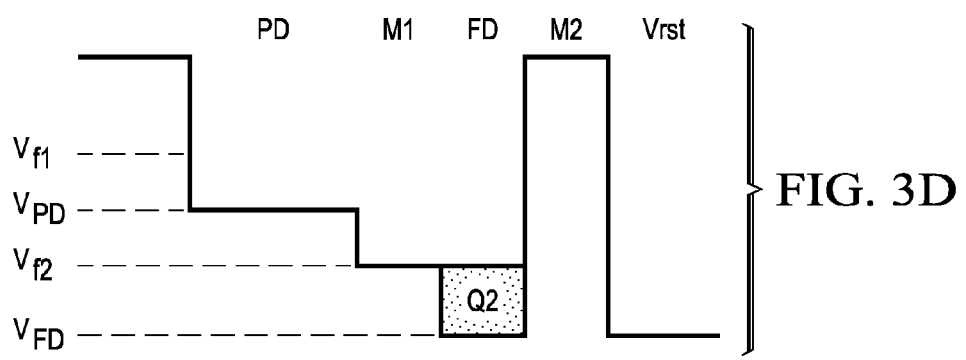

FIG. 3(b) next shows transfer transistor M1 is turned so that it conducts at potential $V_{f1}$. Approximately half of the charge of photodiode PD, from 0 V to potential $V_{f1}$, is transferred to FD. FIG. 3(c) next shows transfer transistor M1 is turned on, charge Q1 accumulated in FD is read, and the charge in FD is again reset. FIG. 3(d) next shows transfer transistor M1 is turned on so that it conducts at potential $V_{f2}$, which is higher than potential $V_{PD}$. Therefore, the remaining charge on photodiode PD, from potential $V_{f1}$ to potential $V_{PD}$, is transferred to FD.

Figure 4:
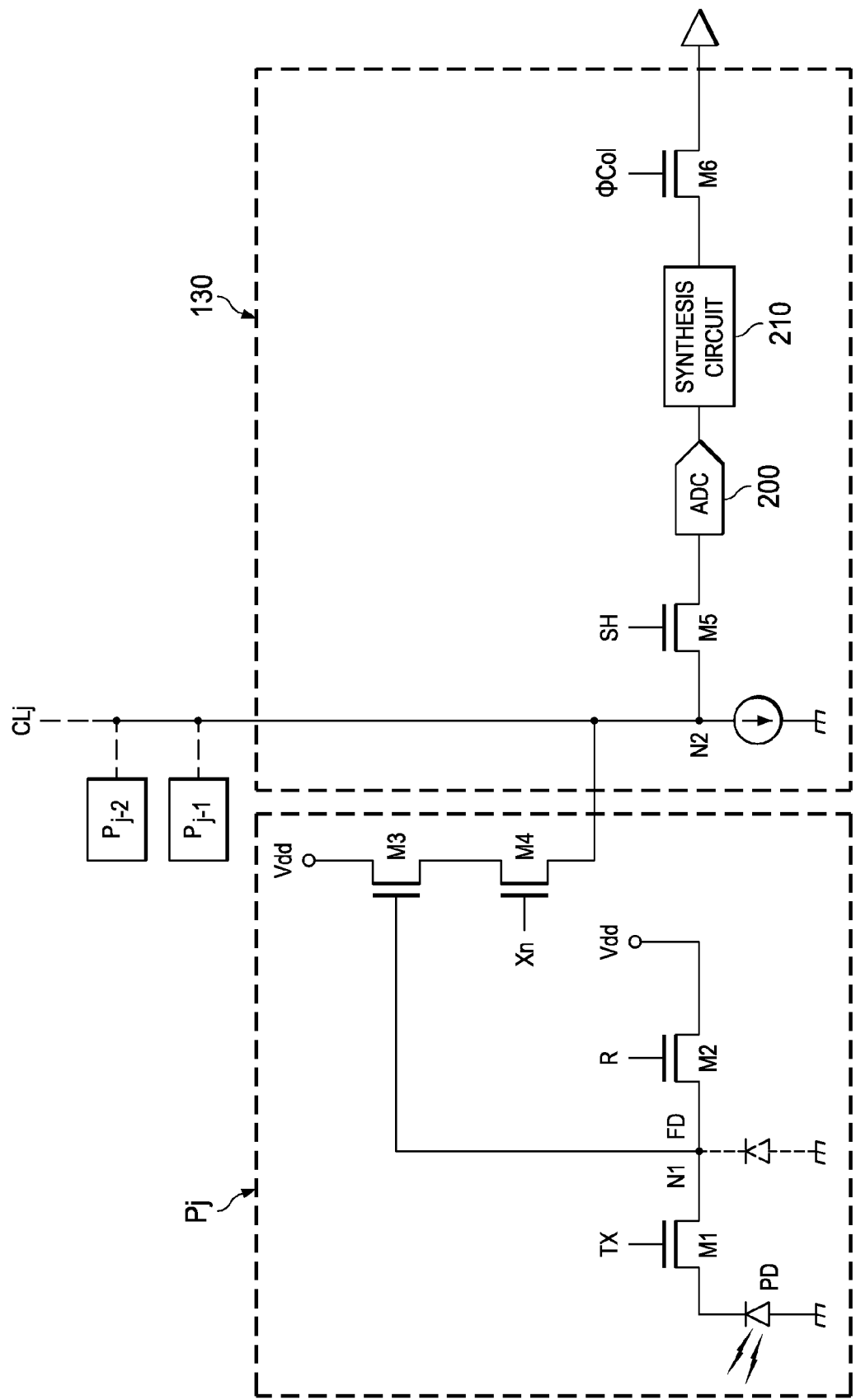
FIG. 4 illustrates a preferred first circuit example of the CMOS image sensor of this embodiment.

FIG. 4 illustrates a preferred first circuit example of a CCD image sensor according to this embodiment. The pixel circuit configuration is the same as the 4 transistors in the conventional type as described above, including transistors M1, M2, M3 and M4. However, capacitance $C_{FD}$ of FD is about ½ of capacitance $C_{PD}$ of photodiode PD. For example, the voltage of photodiode PD is about 1.5 V, Vdd=3.3 V, capacitance $C_{PD}$=1.2 fFd, and capacitance $C_{FD}$=0.8 fFd.

Column output circuit 130 includes a sample-and-hold transistor M5 connected to node N2 of column signal line CLj, an A/D converter 200 that converts analog signals sampled and held by transistor M5 into digital signals, a synthesis circuit 210 that synthesizes the digital converted signals, and an output transistor M6 that outputs the synthesized signals according to signal ΦCol.

As described above, when the charge accumulated in photodiode PD of pixel Pj is read after completion of the accumulation period, the charge of photodiode PD is transferred to FD in two stages. In the example shown in FIG. 4, charge Q1 (Q1=1.2×1.5V=1.8 fC), for example, is transferred in the first transfer operation by transfer transistor M1. Voltage V1 of the signal at FD will be V1=1.8/0.8=2.25 V. The signal voltage of FD is applied to the gate of source follower transistor M3, and output voltage corresponding to this input voltage is produced at node N2 of column output line CLj. When the sample-and-hold signal SH of transistor M5 goes high, the signal at node N2 is supplied to A/D converter 200, where the signal is converted to a digital signal S1. Converted digital signal S1 is supplied to synthesis circuit 210 where it is held.

After sample-and-hold transistor M5 is turned off, reset transistor M2 is again turned on and the charge of FD is reset.

Next, the second transfer operation by transfer transistor M1 is performed and the remaining charge Q2 of photodiode PD is transferred to FD. A charge signal of FD is produced at node N2, as in the first transfer. Then the signal at node N2 is supplied to A/D converter 200 by setting sample-and-hold signal SH of transistor M5 high and converted to a digital signal S2. Converted digital signal S2 is supplied to synthesis circuit 210.

Synthesis circuit 210 combines digital signal S1 from the first transfer and digital signal S2 from the second transfer. The synthesized digital signal is output as a read signal for pixel Pj via transistor M6.

Figure 5:
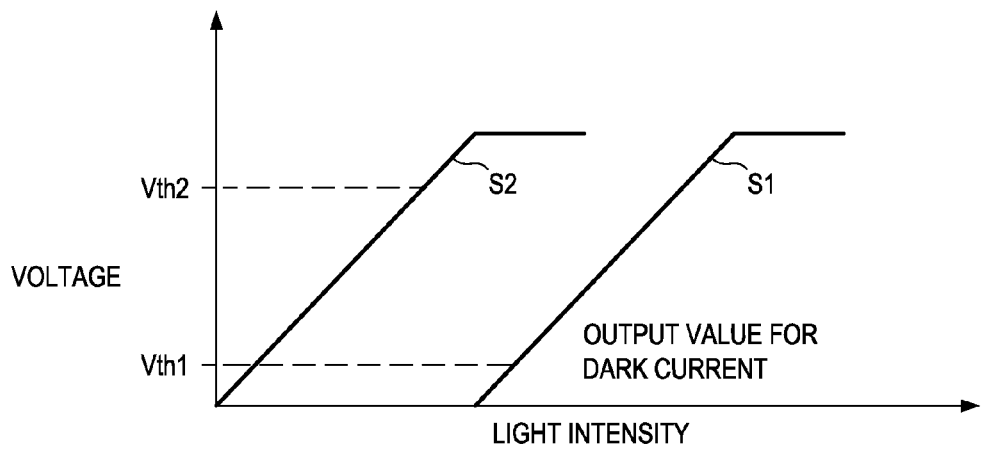
FIG. 5 illustrates a preferred operation example of the synthesis circuit.

FIG. 5 shows a preferred operation example of synthesis circuit 210. In FIG. 5 S1 represents the signal from the first transfer and S2 represents the signal from the second transfer. If signal $S2>V_{th2}$, synthesis circuit 210 generates combined signal S from the signals from the first transfer and the second transfer (S=S1+S2). On the other hand, if $S2 \leq V_{th2}$, synthesis circuit 210 does not combine signal S1 from the first transfer and signal S2 from the second transfer (S=S2). In this case shown in FIG. 2 (c), because the light quantity of photodiode PD is less than 50%, in other words, because charge Q1 transferred the first time is 0, there would be more noise if signal S1 were added. In the same way, if signal $S1>V_{th1}$, then S=S1+S2; and if signal $S1 \leq V_{th1}$, then S=S2, which is satisfactory. The threshold value voltage $V_{th1}$ can be the dark current value which is the output value when there is no incident light or a value close to the dark current value. The threshold voltage value $V_{th2}$ can be the value of the saturation current of signal S2 or a value close to the saturated value.

FIG. 4 illustrates an example combining digital signals S1 and S2 performed on-chip, but this could be performed off-chip. In the latter case, the sampled and held analog signals from the first and second transfers could be output in sequence from column output circuit 130, converted to digital signals by an off-chip A/D converter and combined.

Figure 6:
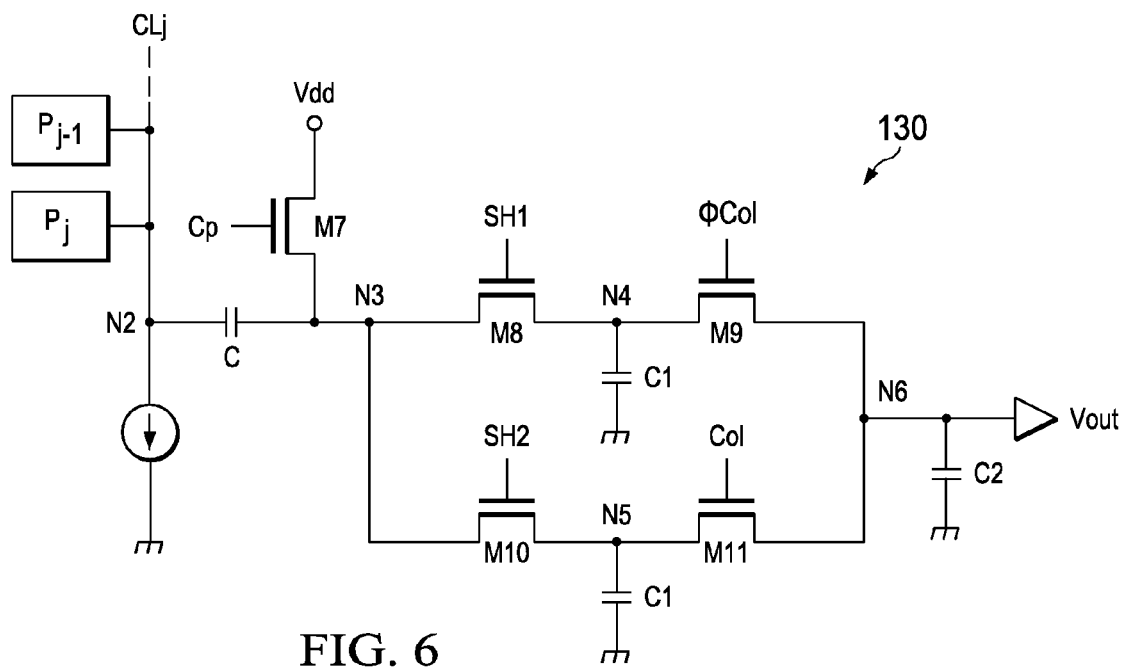
FIG. 6 illustrates a preferred second circuit example of the CMOS image sensor of this embodiment.
Figure 7:
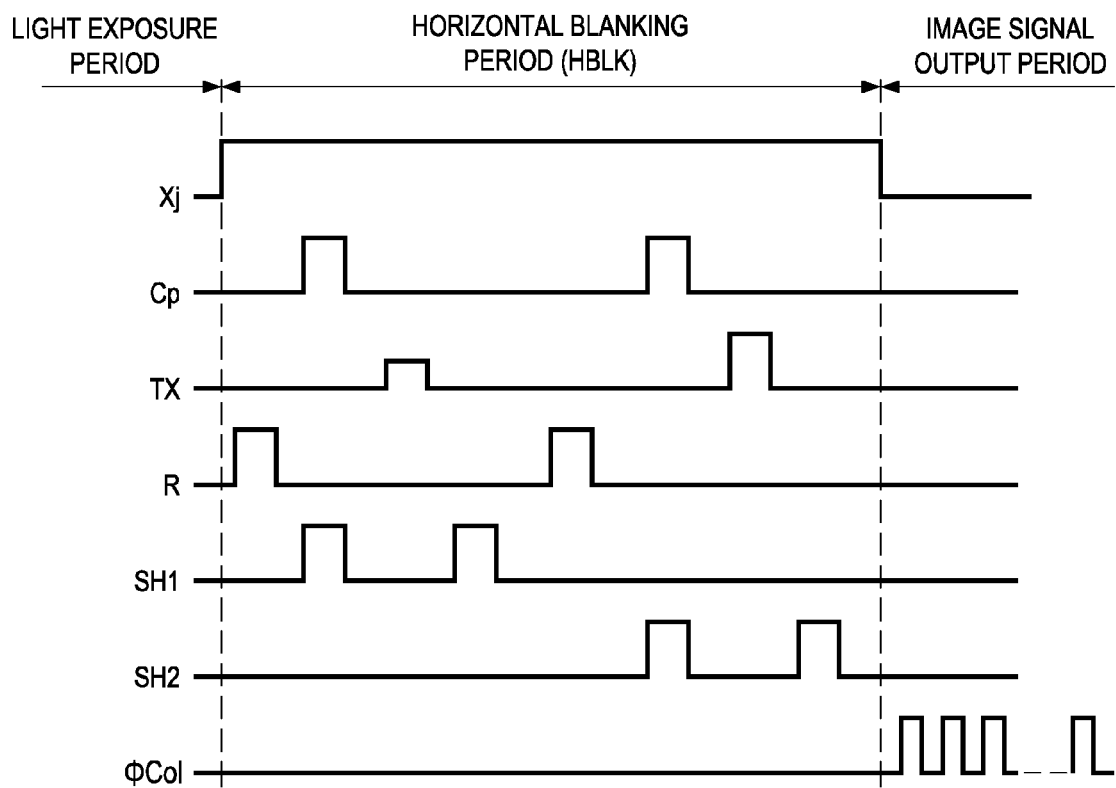
FIG. 7 is a timing diagram for the circuit example of FIG. 6.

FIG. 6 illustrates a second preferred circuit example of a CMOS image sensor of this invention will now be explained. FIG. 7 is a timing diagram used to understand the operation of the circuit of FIG. 6. This second circuit example differs from the first circuit example because the first and second transfer voltages are combined using analog processing.

In FIG. 6 column output circuit 130 includes a clamping transistor M7 connected between node N3 and Vdd, a sample-and-hold transistor M8 connected to node N3, an output transistor M9 connected to sample-and-hold transistor M8, a capacitor C1 connected between connection node N4 of M9 and transistor M8, a sample-and-hold transistor M10 connected to node N3, an output transistor M11 connected to sample-and-hold transistor M10, a capacitor C1 connected between ground and node N5 connecting transistors M10 and M11 and a capacitor C2 connected between ground and node N6 connecting transistors M9 and M11. Column output circuit 130 is connected to node N2 of each column signal line CLj via a capacitor C.

Light exposure (charge accumulation) of photodiode PD is performed as shown in FIG. 7. The light exposure period can be 16.6 msec, for example. When the light exposure period is completed, shift register 120 sequentially drives the lines of the matrix high, so that the pixels for each line are selected. The pixel read period is about 10 μsec. When signals produced by a CMOS image sensor are used for image display, the pixels are read during the horizontal blanking period.

Timing generation circuit 140 (see FIG. 1) next supplies reset signal R to reset transistor M2 via shift register 120 to reset FD. After timing generation circuit 140 supplies the reset signal, gate signal Cp and sample-and-hold signal SH1 go high, clamping transistor M7 and transistor M8 turn on and capacitor C1 is reset. Next, transfer transistor M1 is turned on in the first transfer mode by timing generation circuit 140 supplying a low-voltage gate signal TX to transfer transistor M1 via shift register 120 and charge Q1 of photodiode PD is transferred to FD. A signal with voltage Vs1 corresponding to charge Q1 is thus produced at node N2 of column signal line CLj. Timing generation circuit 140 next drives sample-and-hold signal SH1 high and transistor M8 turns on. Charge Q1 of the first transfer (Q1=C1×VS1) thus accumulates on capacitor C1.

When the first transfer is completed, timing generation circuit 140 supplies a gate signal R to reset transistor M2 via shift register 120 and reset transistor M2 again turns on, resetting FD. Timing generation circuit 140 then turns clamping transistor M7 and sample-and-hold circuit M10 on, resetting capacitor C2. Next, timing generation circuit 140 supplies a gate signal TX to transfer transistor M1 via shift register 120, transfer transistor M1 thereby turns on for the second transfer and remaining charge Q2 of photodiode PD is transferred to FD. A signal at voltage Vs2 corresponding to charge Q2 is obtained at node N2 of column signal line CLj. When transistor M11 is turned on by sample-and-hold signal SH2, charge Q2 from the second transfer (Q2=C1×VS2) accumulates on capacitor C1 at node N5.

Output transistors M9 and M11 turn on when timing generation circuit 140 supplies φCol for the number of column signal lines to column output circuit 130. Charge Q1 and charge Q2 accumulated on the two capacitors C1 are added at node N6 and output as signal Vout according to equation (3):

$$V_{out} = \frac{C1}{2C1 + C2} \times (Vs1 + Vs2) \qquad (3)$$

The signal Vout is output during the image signal output period.

Next, the method for reducing capacitance $C_{FD}$ of FD in this embodiment will be explained. FIG. 8 is a plan view schematically showing a four-transistor pixel. FIG. 9 is a cross section through line A-A in FIG. 8 that is used to explain the parasitic capacitance of FD. FIG. 9(a) shows a conventional configuration and FIG. 9(b) shows the configuration of this embodiment.

In FIG. 8 the region enclosed by the solid line represents the diffusion region and the region enclosed by the broken line represents a polysilicon gate electrode. Capacitance $C_{FD}$ of FD is parasitic capacitance formed at connection node N1 of reset transistor M2 and transfer transistor M1. In a conventional CMOS image sensor, the parasitic capacitance of FD illustrated in FIG. 9(a) includes: wiring capacitance $C_{METAL}$ of the metal wiring connecting node N1 ($n^+$ diffusion region) and the gate of source follower transistor M3; FD junction capacitance $C_{JC}$ between the $n^+$ diffusion region and the p-well of FD; oxidation film capacitance $C_{OX}$ produced by the gate oxidation film of source follower transistor M3; and overlap capacitance $C_{OP}$ between the gate electrode and the source and drain regions produced by the LDD (Lightly Doped Drain) structure of the transistor.

The ratios of each parasitic capacitance are as follows: wiring capacitance $C_{METAL}$ about 18%; FD junction capacitance $C_{JC}$ about 8%; oxidation film capacitance $C_{OX}$ about 22%; and overlap capacitance $C_{OP}$ about 52%. Thus the overlap capacitance $C_{OP}$ produced by the LDD structure accounts for more than half of the total parasitic capacitance. In this invention, ion implantation used to realize the LDD structure is omitted in order to reduce the overlap capacitance $C_{OP}$ produced by the LDD structure. FIG. 9(b) shows n+ diffusion regions (source and drain) matched to the side wall oxide (side wall) of the polysilicon gate were formed for transistors M1, M2 and M3, and no n− diffusion regions matched to the polysilicon gate were formed.

FIG. 10(a) shows the fabrication process for a transistor with a conventional LDD structure. A gate oxide film is formed on a substrate, then a gate electrode is formed using polysilicon, ions are implanted with the polysilicon gate used as a mask, and an n− LDD region is formed. A side wall is then formed on the side wall of the polysilicon gate, and an n+ active region is formed with the polysilicon gate and side walls used as a mask. In this embodiment shown in FIG. 10(b), skips ion implantation for the LDD and skips forming an n− diffusion region that overlaps the gate electrode.

In the embodiment described above, the LDD structure for transistors M1, M2 and M3 was eliminated. However, the LDD structure could also be eliminated for row selection transistor M4. Note that the timing generation circuit 104 and the column output circuit 130 except for the pixels also use an LDD structure.

Figure 11A:
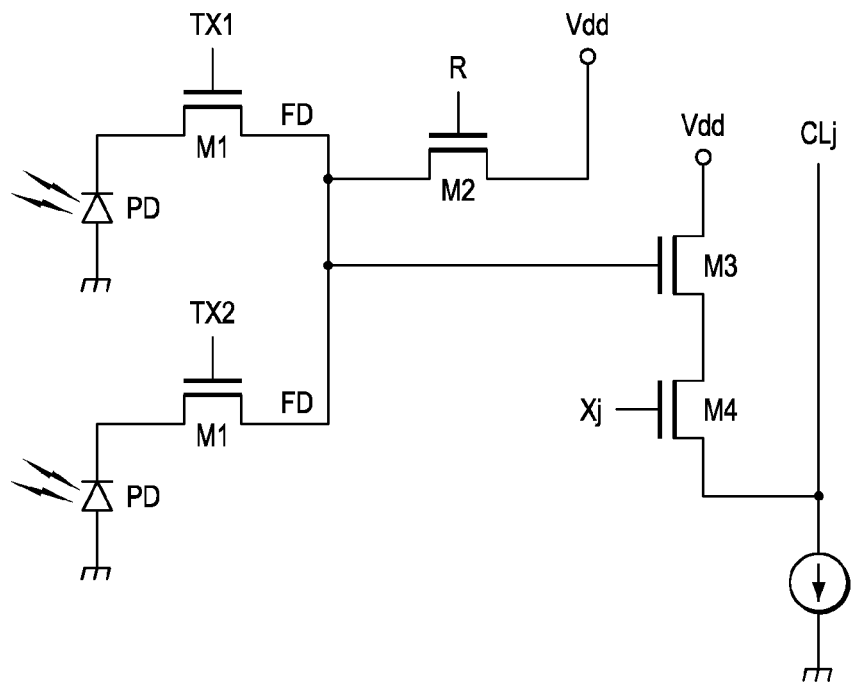
FIG. 11(a) is a circuit example requiring 2.5 transistors per pixel.
Figure 11B:
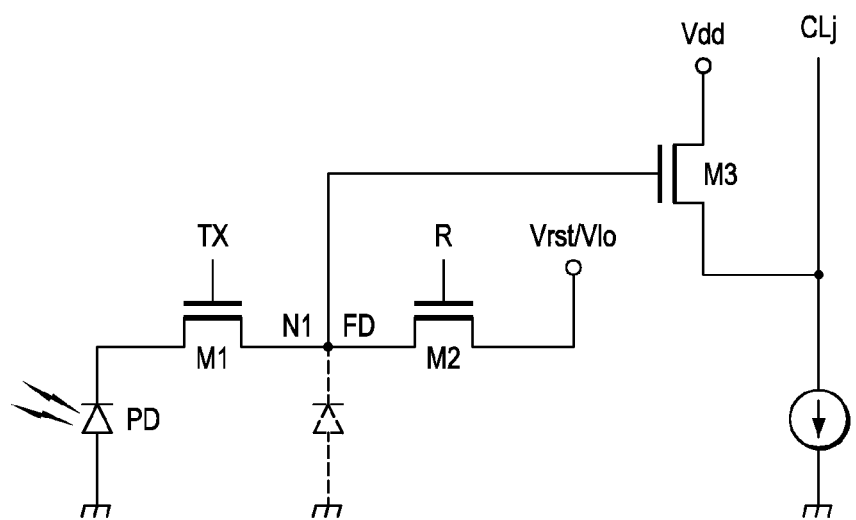
FIG. 11(b) is a circuit example requiring 3 transistors per pixel.

In the embodiment described above, four-transistor pixels were used, but the pixels can be constructed differently. FIG. 11(a) shows a circuit example requiring 2.5 transistors per pixel. In this example, two photodiodes PD1 and PD2 share a reset transistor, a source follower transistor and a row selection transistor. FIG. 11(b) shows the elimination of the row selection transistor from the four-transistor pixel. In this case, reset transistor M2 is selectively connected to 2 values, voltage Vrst and voltage Vlo. When no pixel is to be selected, voltage Vlo is applied to the gate of source follower transistor M3 and the pixels in that row will not be selected.

In the embodiment described above, the capacitance of FD was about ½ of the photodiode capacitance and charge is divided and transferred twice was used. However, the ratio of the capacitance of FD to photodiode capacitance can be changed as required, as can the number of charge transfers. For example, the device could be constituted so that the capacitance of FD is about ⅓ of the photodiode capacitance, and charge is transferred in three stages. The capacitance of FD could be constructed about ¼ of the photodiode capacitance, and charge is divided and transferred in four stages.

A preferred embodiment of the present invention was described above in detail, but the present invention is not limited to a specific embodiment; various modifications and changes within the scope of the essence of the present invention as described in the claims are possible.

The imaging device pertaining to the present invention can be used in digital cameras, portable telephones, and other electronic devices requiring imaging elements.

What is claimed is:

1. An imaging device drive method that includes multiple pixels arranged in a two-dimensional array, where each pixel includes a photodiode that receives light to generate a charge, a capacitance element and a transfer transistor connected between the photodiode and the capacitance element, the capacitance of the capacitance element being less than the capacitance of the photodiode, the method comprising the steps of:

resetting the capacitance element a first time;

accumulating charge in the photodiode by turning the transfer transistor off and isolating the photodiode from the capacitance element;

after accumulating charge, turning the transfer transistor on for a first fixed cycle in a first charge transfer and transferring a first charge accumulated in the photodiode to the capacitance element;

resetting the capacitance element a second time;

after the second resetting, turning the transfer transistor on for a second fixed cycle in a second charge transfer and transferring a second charge accumulated in the photodiode to the capacitance element.

2. The drive method of claim 1, further comprising the step of:

combining the first charge transferred in the first transfer step and the second charge transferred in the second transfer step.

3. The drive method of claim 2, further comprising the steps of:

determining whether the first charge transferred in the first transfer step is less than a threshold value; and when the first charge transferred in the first transfer step is less than the threshold value, then not combining the first charge and the second charge.

4. The drive method of claim 2, further comprising the steps of:

determining whether the second charge transferred in the second transfer step is greater than a threshold value; and when the second charge transferred in the second transfer step is greater than the threshold value, then not combining the first charge and the second charge.

5. The drive method of claim 2, further comprising the steps of:

converting the first charge transferred in the first transfer step into a first digital value;

converting the second charge transferred in the second transfer step into a second digital value; and wherein said combining step includes combining said first and second digital values.

6. The drive method of claim 1, wherein:

said first charge transfer step includes applying a first voltage signal to the gate of the transfer transistor; and said second charge transfer step includes applying a second voltage to the gate of the transfer transistor, the second voltage being greater than the first voltage.

7. The drive method of claim 1, wherein:

said first resetting step, said first transfer step, said second resetting step and the second transfer step are executed during a horizontal blanking period.

8. An imaging device comprising:

multiple pixels arranged in the form of a matrix, wherein each pixel includes a photodiode that photoelectrically converts received light, a capacitance element having less capacitance than the capacitance of the photodiode, and a transfer transistor connected between the photodiode and the capacitance element; and a drive circuit that supplies a first signal for turning the transfer transistor on in a first charge transfer mode, and a second signal for turning the transfer transistor on in a second charge transfer mode after the photodiode accumulation period is completed, wherein the transfer transistor transfers a first charge accumulated in the photodiode to the capacitance element in response to the first transfer signal and transfers a second charge accumulated in the photodiode to the capacitance element in response to the second transfer signal.

9. The imaging device of claim 8, further comprising:

a reset transistor for resetting the capacitance element within each pixel; and wherein said drive circuit additionally supplies a reset signal used for transistor resetting to the first transfer signal and the second transfer signal.

10. The imaging device of claim 9, further comprising:
a MOS transistor connected said capacitance element which does not include a source or drain region produced using LDD implantation to reduce parasitic capacitance between the gate electrode and the source or drain region.

11. The imaging device of claim 8, further comprising:
a column output circuit connected to each pixel through a column signal line, wherein said column output circuit includes a combining circuit that accepts first and second signals corresponding to said first and second charges via said column signal line and combines said first and second signal.

12. The imaging device of claim 11, wherein:
said column output circuit includes an analog-to-digital conversion circuit that converts said first and second signals into corresponding first and second digital signal; and
said combining circuit digitally combines said first and second digital signals.

13. The imaging device of claim 11, wherein:
said combining circuit includes
a first accumulation circuit that accumulates said first signal,
a second accumulation circuit that accumulates said second signal, and
a third accumulation circuit that combines the first and second signals accumulated by said first and second accumulation circuits.

14. The imaging device of claim 13, wherein:
said first accumulation circuit includes a first transistor connected to the column signal line and a first capacitor connected to said first transistors;
said second accumulation circuit includes a second transistor connected to the column signal line and a second capacitor connected to the second transistor; and
said drive circuit supplies a first drive signal to drive said first transistor in response to said first transfer signal and a second drive signal to drive said second transistor in response to said second transfer signal.

* * * * *